US011762295B2

(12) United States Patent
Tavakkoli Kermani Ghariehali et al.

(10) Patent No.: US 11,762,295 B2
(45) Date of Patent: Sep. 19, 2023

(54) FLUID DROPLET METHODOLOGY AND APPARATUS FOR IMPRINT LITHOGRAPHY

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US); Logan L. Simpson, Coupland, TX (US); James W. Irving, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 240 days.

(21) Appl. No.: 17/082,803

(22) Filed: Oct. 28, 2020

(65) Prior Publication Data

US 2022/0128907 A1 Apr. 28, 2022

(51) Int. Cl.
*G03F 7/20* (2006.01)
*B41M 3/00* (2006.01)
*G03F 7/00* (2006.01)

(52) U.S. Cl.
CPC .......... *G03F 7/2012* (2013.01); *B41M 3/006* (2013.01); *G03F 7/0002* (2013.01)

(58) Field of Classification Search
CPC ....... B42D 25/29; G02B 5/124; G03F 7/2012; G03F 7/0002; B29C 64/112; B41M 13/006
See application file for complete search history.

(56) References Cited

U.S. PATENT DOCUMENTS

| 10,120,276 B2 | 11/2018 | Schumaker et al. |
| 10,481,491 B2 | 11/2019 | Fletcher et al. |
| 2007/0091135 A1* | 4/2007 | Hosaka ................ G06K 15/107 347/15 |
| 2008/0018875 A1 | 1/2008 | Schram et al. |
| 2018/0162014 A1* | 6/2018 | Fletcher ................ G03F 7/0002 |
| 2019/0139789 A1 | 5/2019 | Tavakkoli Kermani Ghariehali et al. |
| 2020/0096863 A1 | 3/2020 | Ozturk et al. |

FOREIGN PATENT DOCUMENTS

JP 2018098506 A 6/2018

* cited by examiner

*Primary Examiner* — Tabassom Tadayyon Eslami
(74) *Attorney, Agent, or Firm* — Abel Schillinger, LLP

(57) ABSTRACT

A method can be used to generate a fluid droplet pattern for an imprint lithography process using a fluid dispense system having fluid dispense ports. The method can include determining a fluid droplet pattern for dispensing a formable material onto a substrate, during a first pass, dispensing the formable material along a stitch line to form a first part of the fluid droplet pattern for an imprint field, where the stitch line runs from a first corner to a second corner of the imprint field. The method can also include offsetting the substrate and the fluid dispense ports relative to each other after dispensing the formable material during the first pass, and during a second pass, dispensing the formable material along the stitch line onto the substrate to form a second part of the fluid droplet pattern for the imprint field. An apparatus can be configured to carry out the method.

12 Claims, 4 Drawing Sheets

FLUID DROPLET METHODOLOGY AND APPARATUS FOR IMPRINT LITHOGRAPHY

FIELD OF THE DISCLOSURE

The present disclosure relates to imprint lithography, and more particularly to fluid droplet patterning for imprint lithography applications.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist, onto the wafer, using techniques such as fluid droplet dispense. The dispensed material is contacted with an imprint template (or mold) having desired pattern features and then solidified, forming a patterned layer on the wafer. Template feature fill rates and related defects are dependent, in part, on template pattern feature density and orientation and the droplet pattern arrangement, including fluid droplet pitch.

Traditional fluid dispense systems permit some adjustment of inter-droplet spacing, however, they typically have constraints that limit the extent of such adjustments. The fluid dispense systems include fluid dispense ports having a fluid dispense port pitch that determines the fluid droplet pitch in the same direction as the fluid dispense port pitch. Defects can arise as dispense material spreads on the substrate. Thus, there continues to be an industry demand for improvements in fluid deposition techniques and more specifically for droplet pattern processes which are more finely adjustable and which are not limited by dispenser limitations.

SUMMARY OF THE INVENTION

In an embodiment, a method can be used to generate a fluid droplet pattern for an imprint lithography process. The method comprises: providing a fluid dispense system having fluid dispense ports; determining a fluid droplet pattern for dispensing a formable material onto a substrate; during a first pass, dispensing the formable material onto the substrate to form a first part of the fluid droplet pattern for an imprint field, wherein the substrate and the fluid dispense ports move relative to each other in a translating direction; offsetting the substrate and the fluid dispense ports relative to each other in the translating direction and another direction, wherein offsetting the substrate and the fluid dispense ports relative to each other is performed after dispensing the formable material during the first pass; and during a second pass, dispensing the formable material onto the substrate to form a second part of the fluid droplet pattern for the imprint field, wherein dispensing the formable material during the second pass is performed after offsetting the substrate and the fluid dispense ports relative to each other.

In an embodiment, an apparatus for imprint lithography is disclosed. The apparatus can include a fluid dispense head including at least two fluid dispense ports; a stage configured to hold a substrate, where the stage and the fluid dispense head are adapted to move the substrate and the at least two fluid dispense ports relative to each other; and a logic element configured to: transmit information to move the substrate relative to the fluid dispense head in a translating direction while performing the following steps: transmit information to dispense a formable material onto the substrate to form a first part of the substrate fluid droplet pattern along a stitch line, where the stitch line is a diagonal line that runs from a first corner to a second corner of an imprint field; transmit information to move the fluid dispense head in an offset direction, where the offset direction is different than the translating direction, where the apparatus is configured to move the fluid dispense head after an instruction to dispense the formable material is executed; and transmit information to dispense the formable material onto the substrate to form a second part of the substrate fluid droplet pattern along the stitch line, where the apparatus is configured to dispense the formable material after an instruction to move the fluid dispense head in the offset direction is executed, and where the first part of the fluid droplet pattern is dispensed during a first pass and the second part of the fluid droplet pattern is dispensed during a second pass.

In another embodiment, the offset direction and the translating direction are in a plane parallel to the surface of the substrate.

In a further embodiment, the first corner and the second corner are on opposite sides of a congruent side of the imprint field.

In still a further embodiment, the first corner and the second corner are on opposite sides of a diagonal of the imprint field.

In yet another embodiment, determining a substrate fluid drop pattern is for an imprint field.

In a particular embodiment, the offset direction comprises a first offset direction and a second offset direction different from the first offset direction.

In another embodiment, a method of generating a fluid droplet pattern on a substrate is disclosed. The method can include providing a fluid dispense system having fluid dispense ports; determining a fluid droplet pattern for dispensing a formable material onto a substrate; during a first pass, dispensing the formable material onto the substrate along a stitch line to form a first part of the fluid droplet pattern for an imprint field, where the substrate and the fluid dispense ports move relative to each other in a translating direction, where the stitch line is a diagonal line that runs from a first corner to a second corner of an imprint field; offsetting the substrate and the fluid dispense ports relative to each other in the translating direction and another direction, where offsetting the substrate and the fluid dispense ports relative to each other is performed after dispensing the formable material during the first pass; and during a second pass, dispensing the formable material along the stitch line onto the substrate to form a second part of the fluid droplet pattern for the imprint field, where dispensing the formable material during the second pass is performed after offsetting the substrate and the fluid dispense ports relative to each other.

In another embodiment, the first corner and the second corner are on opposite sides of a congruent side of the imprint field.

In a particular embodiment, the stitch line comprises more than one segment.

In a further embodiment, the stitch line comprises a horizontal segment.

In an embodiment, the stitch line comprises a vertical segment.

In a further embodiment, determining a substrate fluid drop pattern is for an imprint field.

In an embodiment, the offset direction and the translating direction are in a plane parallel to the surface of the substrate.

In another embodiment, dispensing the formable material onto the substrate along a stitch line to form the first part of the fluid droplet pattern for the imprint field comprises starting to dispense formable material at the stitch line and ending at a first edge of the imprint field.

In a particular embodiment, dispensing the formable material onto the substrate along a stitch line to form the second part of the fluid droplet pattern for the imprint field comprises starting to dispense formable material at the stitch line and ending at a second edge of the imprint field, where the first edge is opposite the second edge.

In a more particular embodiment, dispensing the formable material onto the substrate along a stitch line to form the first part of the fluid droplet pattern for the imprint field comprises forming at least two rows of fluid droplets, where each row of fluid droplets has a different number of fluid droplets than the row either above or below it.

In another embodiment, after dispensing the formable material onto the substrate along a stitch line to form the second part of the fluid droplet pattern for the imprint field, each of the at least two rows has substantially the same number of fluid droplets.

In a further embodiment, a method of manufacturing an article is disclosed. The method can include providing a fluid dispense system having fluid dispense ports; determining a fluid droplet pattern for dispensing a formable material onto a substrate; during a first pass, dispensing the formable material onto the substrate along a stitch line to form a first part of the fluid droplet pattern for an imprint field, where the substrate and the fluid dispense ports move relative to each other in a translating direction, where the stitch line is a diagonal line that runs from a first corner to a second corner of an imprint field; offsetting the substrate and the fluid dispense ports relative to each other in the translating direction and another direction, where offsetting the substrate and the fluid dispense ports relative to each other is performed after dispensing the formable material during the first pass; during a second pass, dispensing the formable material along the stitch line onto the substrate to form a second part of the fluid droplet pattern for the imprint field, where dispensing the formable material during the second pass is performed after offsetting the substrate and the fluid dispense ports relative to each other; contacting the formable material with a template having a surface; curing the formable material to form a layer corresponding to the surface of the template; forming a pattern on the substrate by the cured material on the substrate; processing the substrate on which the pattern has been formed; and manufacturing the article from the processed substrate.

BRIEF DESCRIPTION OF THE DRAWINGS

Embodiments are illustrated by way of example and are not limited in the accompanying figures.

Figure 1:
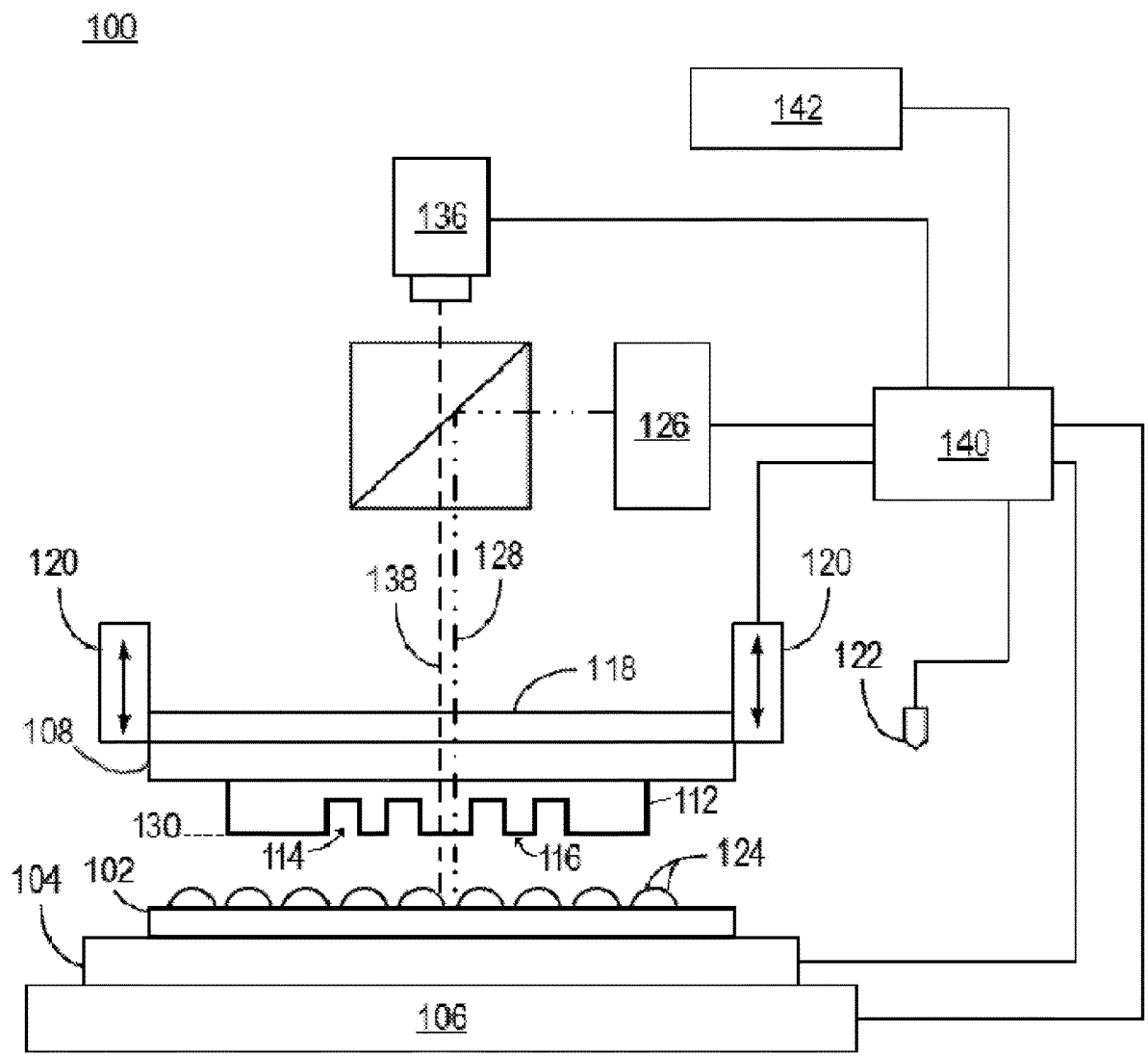
FIG. 1 includes an illustration of a side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "pitch" is intended to mean a distance from a center of a feature to a center of a next adjacent feature. For a fluid droplet pattern, the pitch is a distance from the center of a droplet to the center of the next adjacent droplet. In Cartesian coordinates, a two-dimensional pattern (a pattern as seen from a top or plan view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the term "field" is intended to mean a portion of a substrate. For example, in a step-and-repeat process, a substrate is divided into about 100 fields and each field is processed in different steps.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Details regarding the apparatus and method are better understood after reading this specification in conjunction with figures. The description below is meant to illustrate embodiments and not limit the scope of the present invention, which is defined in the appended claims.

In imprint lithography, formable material needs to be dispensed in a controlled matter to ensure that a proper amount of formable material is dispensed in correct locations and areal densities on the substrate. A drop edge exclusion (DEE) refers to an exclusion around a substrate fluid droplet pattern to achieve a proper amount of formable material near the edge of an imprint field that reduces the likelihood that (1) the formable material will flow beyond the edge of the imprint lithography template and (2) non-fill defects will occur. In actual practice, the proper DEE is difficult to obtain. Centers of fluid droplets closest to the edges of the imprint field are placed such that, during an imprint operation, a proper amount of formable material can flow toward the edge of the imprint field. If the fluid droplets are too close to the edge, a portion of the formable material can flow beyond an edge of the imprint lithography template and such portion of the formable material can upon curing, adhere to the template and lead to extrusion defects. That is, during subsequent imprinting, the adhered material can detach from the template and contaminate the subsequently imprinted layer, causing a defect in subsequent pattern transfer processes which can ultimately affect device yield. If the fluid droplets are too far from the edge, incomplete filling of template features may occur. Such defects are called "non-fill" defects and translate to a loss of features upon pattern transfer. Extrusion defects and non-fill defects are undesired.

Referring to the figures, and particularly to FIG. 1, a lithographic apparatus 100 in accordance with embodiments described herein can be used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a template 108. The template 108 can include a body having a first side and a second side with one side having a mold 112 extending therefrom towards the substrate 102. In one embodiment, the mold 112 may be a mesa. In an embodiment, the template 108 can be formed without a mold 112. The template 108 or mold 112 may be formed from materials including, but not limited to, fused silica, quartz, silicon, organic polymers, siloxane polymers, borosilicate glass, fluorocarbon polymers, metal, hardened sapphire, and/or the like. In an embodiment the template 108 is readily transparent to UV light.

The template 108 and mold 112 can include a single piece construction. Alternatively, the template 108 and mold 112 can include separate components coupled together. As illustrated, a working surface 130 includes features defined by spaced-apart recesses 114 and protrusions 116. The disclosure is not intended to be limited to such configurations (e.g., planar surfaces). The working surface 130 may define any original pattern that forms the basis of a pattern to be formed on the substrate 102. In another embodiment, the working surface 130 of the template 108 can include a planar contact surface.

Template 108 may be coupled to or retained by a chuck 118. The chuck 118 may be, but is not limited to, vacuum chuck, pin-type chuck, groove-type chuck, electrostatic chuck, electromagnetic chuck, and/or other similar chuck types. The chuck 118 may be configured to apply stress, pressure, and/or strain to template 108 that varies across the template 108. In an embodiment the chuck 118 is likewise readily transparent to UV light. The chuck 118 may include a system such as a zone based vacuum chuck, an actuator array, a pressure bladder, etc., which can apply a pressure differential to a back surface of the template 108 to cause the template 108 to bend and deform.

The chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the chuck 118 relative to the substrate 102 in at least the z-axis direction, and potentially other directions (e.g. x-, y-, θ-, ψ-, and φ-axis).

The lithographic apparatus 100 may further comprise a fluid dispenser 122 used to deposit a formable material 124 on the substrate 102. The fluid dispenser 122 can include fluid dispense ports. In one embodiment, the fluid dispenser 122 can include six fluid dispense ports; however, the number of fluid dispense ports can be less than or greater than six, such as for example, at least two fluid dispense ports, at least three fluid dispense ports, at least four fluid dispense ports, at least five fluid dispense ports, at least ten fluid dispense ports, or at least twenty fluid dispense ports. In an embodiment, the fluid dispenser 122 can include a set of at least three fluid dispense ports lying along a straight line. In traditional dispensing operations of formable material, a Y-direction pitch is fixed by a distance between centers of adjacent fluid dispense ports, and therefore, the Y-direction pitch is determined by the physical layout of the fluid dispense ports in the fluid dispenser 122 head.

The formable material 124 can include a polymerizable material, such as a resin. In an embodiment, the fluid dispenser 122 and the head 120 share one or more of all positioning components. In an alternative embodiment, the fluid dispenser 122 and the head 120 move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. The formable material 124 can be dispensed upon the substrate 102 before or after a desired volume is defined between the mold 112 and the substrate 102 depending on design considerations.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof.

The lithographic apparatus 100 may further comprise a curing system that includes a radiation source 126 that directs actinic energy, for example, UV radiation, along an exposure path 128. The head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 124. FIG. 1 illustrates the exposure path 128 when the template 108 is not in contact with the formable material 124. This is done for illustrative purposes so that the relative position of the individual components can be easily identified. An individual skilled in the art would understand that exposure path 128 would not substantially change when the template 108 is brought into contact with the formable material 124.

The lithographic apparatus 100 may further comprise a camera 136 positioned to view the spread of formable material 124 as the template 108 contacts the formable material 124. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the template 108 and in contact with the formable material 124 and regions underneath the template 108 but not in contact with the formable material 124. The camera 136 may be configured to provide images of the spread of formable material 124 underneath the template 108, and/or the separation of the template 108 from cured formable material 124. The camera 136 may also be configured to measure interference fringes, which change as the formable material 124 spreads between the gap between the surface 130 and the substrate surface.

The apparatus 100 may be regulated, controlled, and/or directed by one or more processors 140 (controller) in communication with one or more components and/or subsystems such as the substrate chuck 104, the substrate positioning stage 106, the chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the head 120, the substrate position stage 106, or both vary a distance between the template 108 and the substrate 102 to define a desired space (a bounded physical extent in three dimensions) that is filled with the formable material 124. For example, the head 120 may be moved toward the substrate and apply a force to the template 108 such that the template 108 contacts and spreads droplets of the formable material 124.

In imprint lithography, the formable material needs to be dispensed in a controlled matter to ensure that a proper amount of formable material is dispensed in correct locations and areal densities on the substrate. Centers of fluid droplets closest to the edges of the imprint field are placed such that, during an imprint operation, a proper amount of formable material can flow toward the edge of the imprint field. If the fluid droplets are too close to the edge, a portion of the formable material can flow beyond an edge of the imprint lithography template, and such portion of the formable material can result in an extrusion defect during a curing operation. The extrusion defect may adhere to the lithography template and cause the extrusion defect to be printed in the next imprint field. If the fluid droplets are too far from the edge, incomplete filling of template features may occur. Such defects are called "non-fill" defects and translate to a loss of features upon pattern transfer. Extrusion defects and non-fill defects are undesired.

High throughput at low defect density is an important consideration in imprint lithography processes. When employing a droplet dispense method of applying the formable material to the substrate 102, the imprint process cycle generally includes (1) dispensing (or depositing) fluid droplets of formable material on a substrate surface, (2) bringing a template into contact with the fluid droplets such that the fluid spreads and fills the topography of the template patterning surface, (3) solidifying (e.g., photocuring) the fluid, and (4) separating the template from the substrate 102, leaving a solidified layer of formable material having a relief image of the template pattern on the substrate surface. Dispensing fluid droplets of formable material on the substrate surface and proper filling of the pattern of the template 108 are major contributors to the imprint cycle time, and thus throughput. Particular template patterns may require multiple passes of the substrate 102 relative to the imprint head 130. That is, the substrate 102 and imprint head 130 must be translated relative to each other multiple times. Multiple dispensing passes are common, for example, when templates have dense feature patterns or for particular patterns requiring adjacent droplets be positioned closer together. Methods and systems to reduce dispense time are described in accordance with one or more embodiments described herein.

During dispensing, fluid droplets of formable material 124 are dispensed from the fluid dispenser 122 to create a pattern of fluid droplets on the surface 203 of the substrate 102. The fluid droplet pattern can be determined such that the total volume of the fluid droplets on the surface matches the total volume for the desired fluid droplet pattern. As well as matching the total volume of the desired fluid droplet pattern, it may be desirable to match the local volume of the desired fluid droplet pattern. Thus, a greater volume of fluid can be dispensed in a region of the substrate 102 where a greater volume of formable material is desired.

Available inkjet systems can be tuned to dispense formable material fluid droplets with volumes in the range of 0.1 to 10 picoliters (pL) or greater, with 0.9 pL being an exemplary fluid droplet volume. The fluid droplets can be dispensed in patterns formed by one or more passes of the imprint head 130 and substrate 102 relative to one another. An exemplary pattern includes a rectangular, grid pattern, a diamond pattern, another suitable pattern, or any combination thereof.

The fluid dispenser 122 and the surface 203 located there below (e.g., on the substrate 102) can be moveable relative to each other in a translating direction (illustrated by arrow 208). Fluid droplets 205 can be dispensed from the fluid dispenser 122 onto the surface 203 in rows and columns along the stitch line 207.

As previously discussed, the fluid dispense head can have presets that can limit the flexibility of the fluid dispense system and produces a preset minimum pitch (Y-direction pitch) when the substrate 102 is translated at a preset scan speed in the X-direction. Unlike drop pattern width (X-direction pitch), the drop pattern height (Y-direction pitch) cannot be uniformly expanded or contracted by changing dispense scan speed or dispenser firing frequency. Additionally, as a system does multiple passes, different drop densities result in different residual layer thickness (RLT) at the junction of two patterns, known as the stich line. Different RLTs can cause problems for patterned wafer inspection tools that are calibrated and optimized for certain film thicknesses, can cause mask distortion and overlay errors, can reduce the etch pattern transfer process, and non-fill errors. Needless to say, the limitations on the fluid dispense port pitch and presets of the apparatus can allow a less-than ideal droplet pattern.

In an embodiment, a drop pattern can be divided between diagonally opposed corners and each section can be dispensed on separate dispense passes. In the embodiment as illustrated, the other offset direction can be substantially perpendicular to the translating direction 208, substantially parallel to the line 208, or both. As used herein, substantially perpendicular means±10° of perpendicular, and substantially parallel means±10° of parallel. The translating offset distance can be non-integer multiple of the preset minimum pitch, and the other offset distance can be non-integer multiple of the fluid dispense port pitch. More detail regarding the offset is provided below.

Figure 2A:
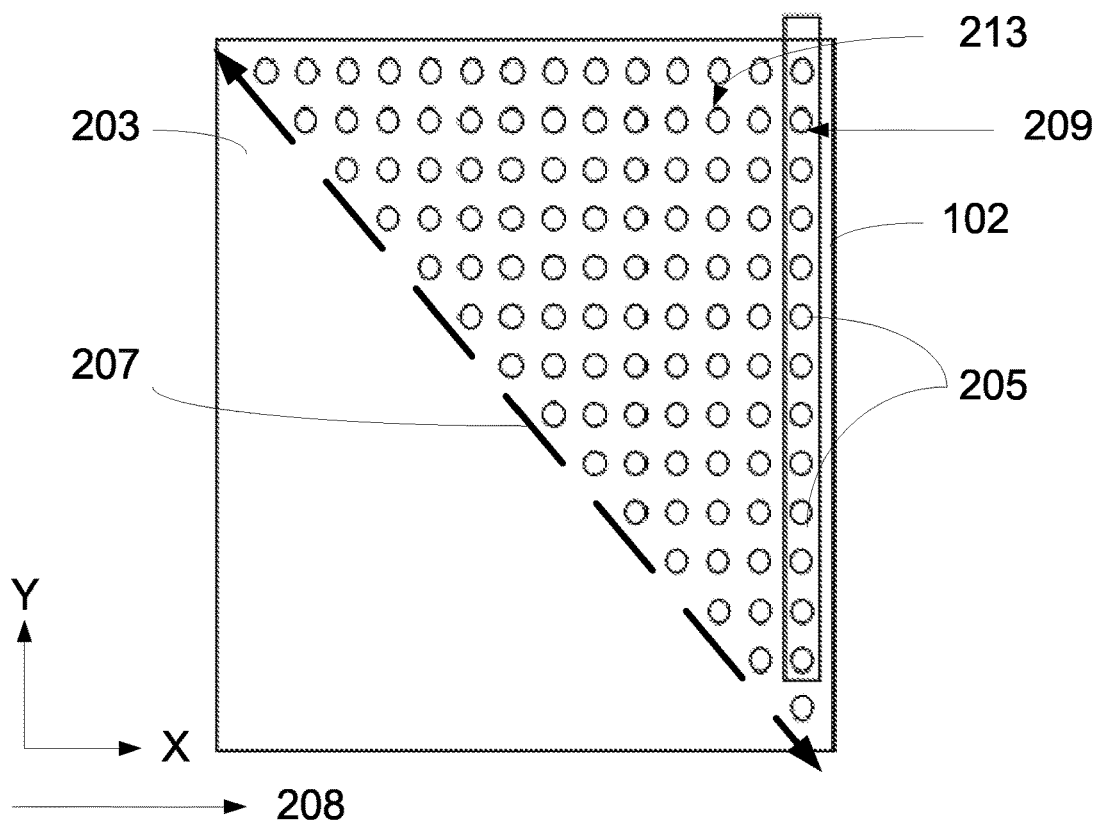
FIG. 2A includes a simplified top view of a fluid droplet pattern after a single pass in accordance with an embodiment.
Figure 2B:
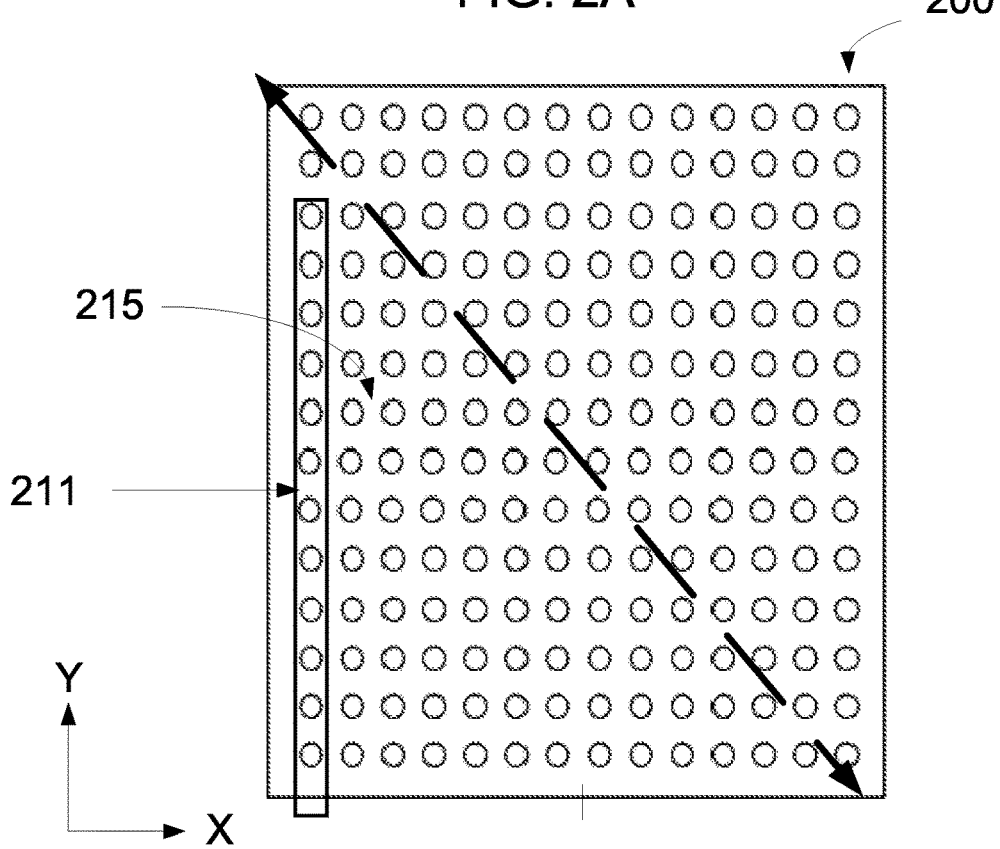
FIG. 2B includes a simplified top view of the fluid droplet pattern of FIG. 2A during another pass in accordance with an embodiment.
Figure 4:
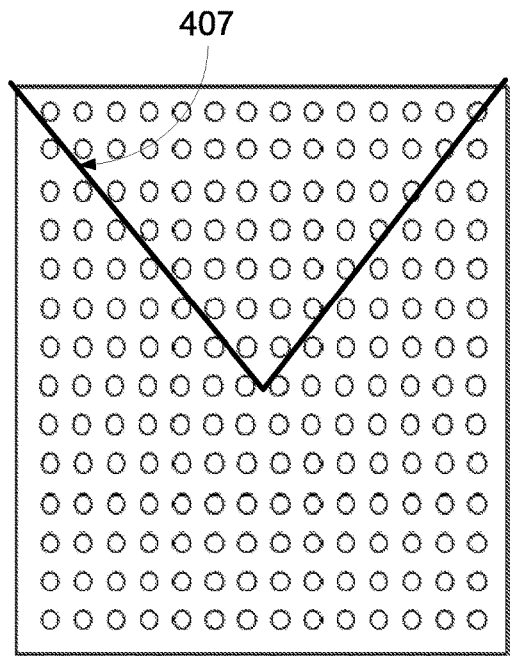
FIG. 4 includes a simplified top view of a fluid droplet pattern that matches the X-direction and Y-direction alignment for a drop edge exclusion in accordance with an embodiment.
Figure 5:
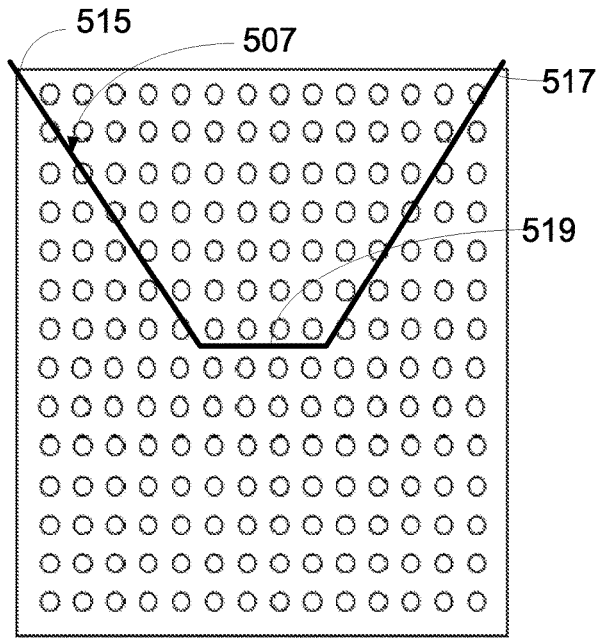
FIG. 5 includes a simplified top view of a fluid droplet pattern that matches the X-direction and Y-direction alignment for a drop edge exclusion in accordance with an embodiment.
Figure 6:
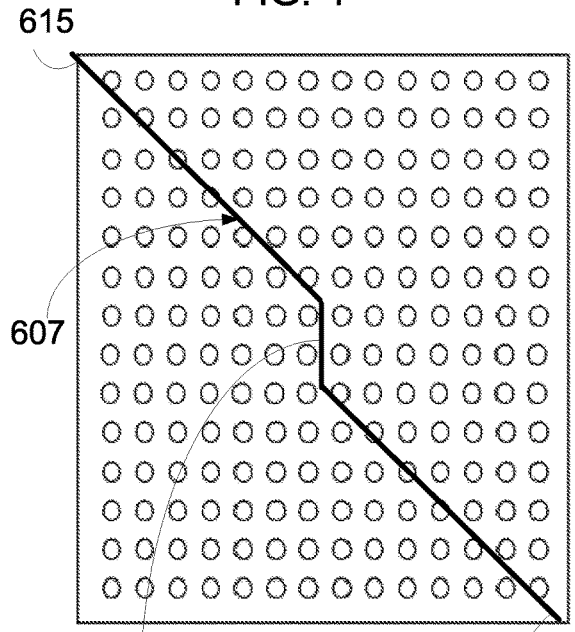
FIG. 6 includes a simplified top view of a fluid droplet pattern that matches the X-direction and Y-direction alignment for a drop edge exclusion in accordance with an embodiment.
Figure 7:
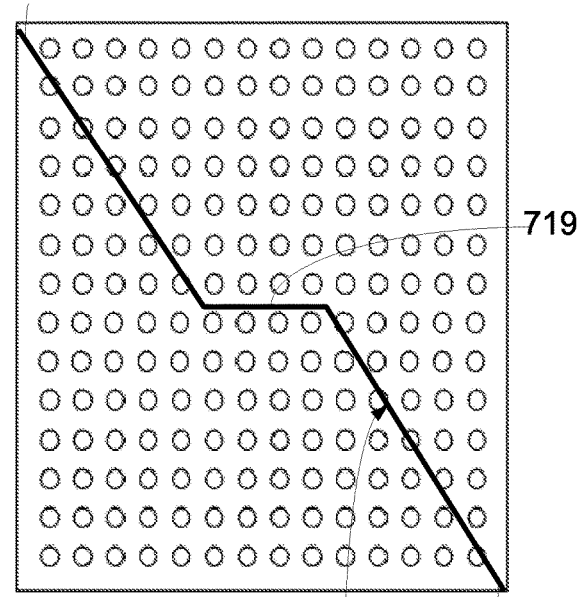
FIG. 7 includes a simplified top view of a fluid droplet pattern that matches the X-direction and Y-direction alignment for a drop edge exclusion in accordance with an embodiment.

FIG. 2A includes a fluid droplet pattern 200 in which the fluid dispenser 122 is movable in the X-direction and Y-direction and the firing rate of the fluid dispenser 122 along a stitch line 207. The stitch line 207 can be a line that goes from one corner to an opposite corner along a diagonal of the substrate 102, as shown in FIGS. 2A-2B. In another embodiment, the stitch line 407 can go from one corner to an opposing corner along a congruent length of the substrate 102, as seen in FIG. 4. The stitch line can be diagonal, vertical, horizontal, or any combination thereof. In one embodiment, the stitch line 507 can start at first corner 515, end at a second corner 517 opposite along a congruent length, and include a substantially horizontal section 519 in between, as seen in FIG. 5. In another embodiment, the stitch line 607 can start at first corner 615, end at a second corner 617 opposite along a diagonal, and include a substantially vertical section 619 in between, as seen in FIG. 6. In another embodiment, the stitch line 707 can start at first corner 715, end at a second corner 717 opposite along a diagonal, and include a substantially horizontal section 719 in between, as seen in FIG. 7.

In one embodiment, a first part 213 of the droplet pattern 200 can be dispensed in a first pass, starting along the stitch line 207 and ending along a first edge, as demarcated by the trailing edge 209, where the trailing edge is along an edge of the imprint field of the substrate 102. In another embodiment, the first part 213 of the droplet pattern 200 can be dispensed in a first pass, starting to dispense formable material along the first edge of the imprint field of the substrate 102, and ending along the stitch line 207. The first pass can form a first part of the droplet pattern 200 where each row of formable material contains a different number of droplets than the row above or below it. In one embodiment, each row of formable material contains more droplets that the row above it and less droplets than the row below it. In another embodiment, each row of formable material contains less droplets that the row above it and more droplets than the row below it. After adjusting the scan speed, a second part 215 of the droplet pattern 200 can be dispensed in a second pass, starting along the stitch line 207 and ending along a second edge, where the second edge is opposite the first edge, as demarcated by trailing edge 211. In another embodiment, the second part 215 of the droplet pattern 200 can be dispensed in a second pass, starting to dispense formable material along the second edge of the imprint field of the substrate 102—where the second edge is opposite the first edge—and ending along the stitch line 207. By moving the fluid dispenser 122 along the stitch line, and altering either the scan speed or the firing frequency, the RTL can be more finely controlled. In one embodiment, the fluid dispenser 122 moves in both the translating direction 208 and offset direction while the substrate 102 remains stationary. In another embodiment, the fluid dispenser 122 moves in a diagonal direction—being the summation of moving in both the translating direction 208 and offset direction—while the substrate 102 remains stationary. In another embodiment, the fluid dispenser 122 moves in the offset direction while the substrate 102 moves in the translating direction 208. In yet another embodiment, the fluid dispenser 122 moves in the translating and offset direction while the substrate 102 also moves in the translating direction, but where when moving in the translating directions, the fluid dispenser 122 and the substrate 102 are moving at different speeds.

Figure 3:
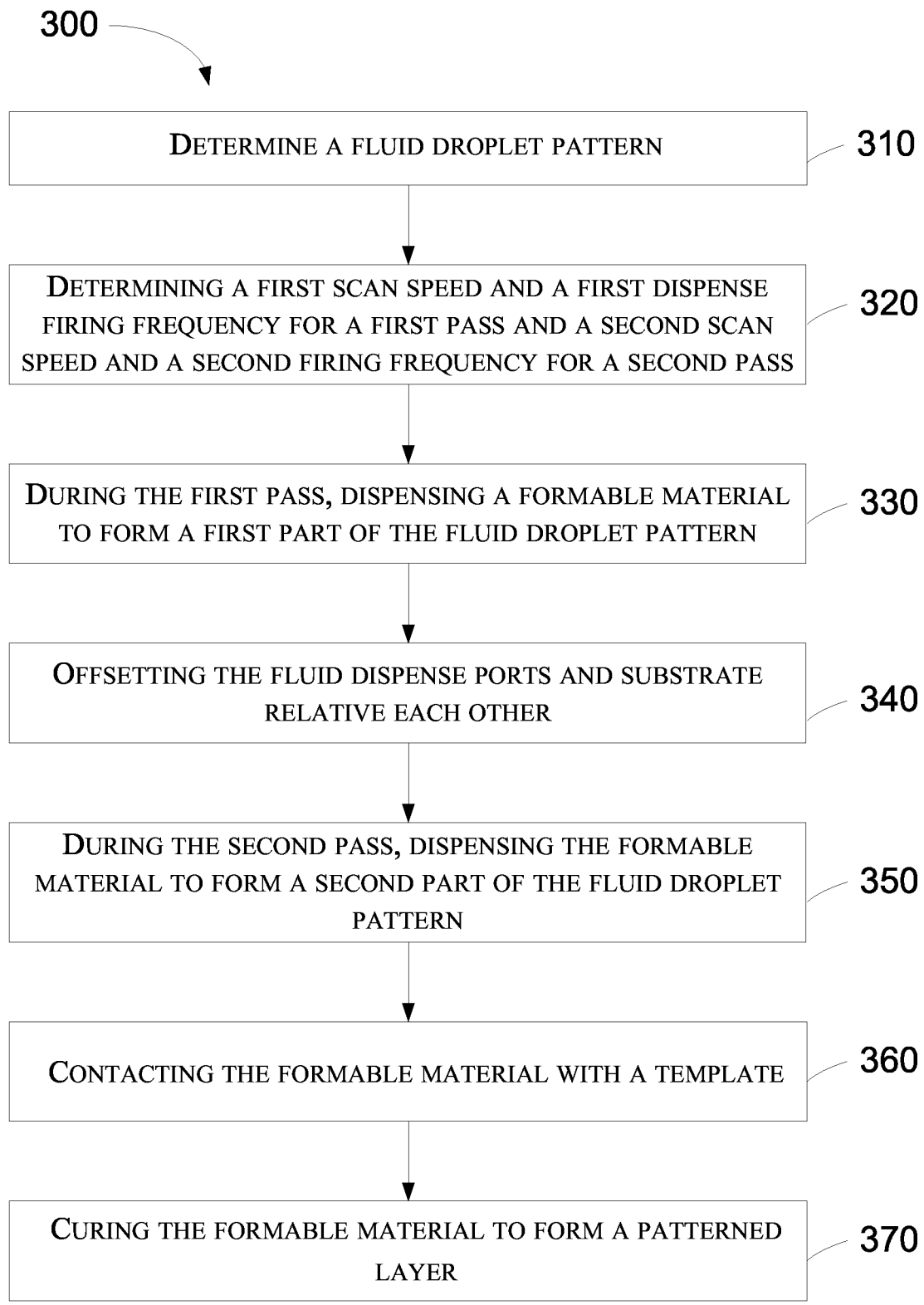
FIG. 3 includes a flow chart of an exemplary method of forming an article, including generating a fluid droplet pattern.

In accordance with an embodiment described herein, FIG. 3 includes a flow chart for a method 300 that can be used forming a substrate fluid droplet pattern for an imprint lithography process that includes an offset between passes of dispensing the fluid droplets. The method can be performed by an imprint lithography apparatus 100 including a fluid dispenser, a stage, and a logic element. The fluid dispenser can further be configured to dispense fluid droplets of a formable material at a preset frequency to achieve spaced-apart droplets on a substrate. The stage, the fluid dispenser, or both can be adapted to move relative to each other in a translating direction. The logic element can include hardware, firmware, software, or any combination thereof to perform many of the operations described herein. In a particular embodiment, the logic element can be the processor. The substrate 102 can be placed on the stage, and in an embodiment, the substrate 102 can be a semiconductor wafer.

The method can include determining a fluid droplet pattern for dispensing the formable material onto the substrate 102, at block 310 in FIG. 3. Determining the fluid droplet pattern could include determining the stitch line for the substrate 102. In a particular embodiment, the stitch line 102 can be a diagonal line that extends from one corner of an imprint field of the substrate 102 to a second corner of the imprint field of the substrate 102. In this particular embodiment, the formable material is dispensed using more than one pass. The fluid droplet pattern refers to a particular virtual droplet pattern, and in an embodiment, such virtual droplet pattern can be corresponded to the substrate fluid droplet pattern produced when using the fluid droplet pattern.

The method can continue at block 320 by determining a first scan speed and a first dispense firing frequency for a first pass and a second scan speed and a second firing frequency for a second pass prior to dispensing formable material on the substrate. In one embodiment, the first scan speed can be the same as the second scan speed. In another embodiment, the first scan speed can be different from the second scan speed. In one embodiment, the first scan speed is faster than the second scan speed. In another embodiment, the first scan speed is slower than the second scan speed. In one embodiment, the first firing frequency can be the same as the second firing frequency. In another embodiment, the first firing frequency can be different from the second firing frequency. In one embodiment, the first firing frequency is more than the second firing frequency. In another embodiment, the first firing frequency is less than the second firing frequency. In one embodiment, the first scan speed can be between 0.1 m/sec to 2 m/sec. In another embodiment, the second scan speed can be between 0.1 m/sec to 2 m/sec. In one embodiment, the first firing frequency can be between 1 khz to 1 Mhz. In another embodiment, the second firing frequency can be between 1 khz to 1 Mhz.

The substrate 102 is placed and held onto the stage. The method can include, during a first pass, dispensing the formable material to form a first part of the fluid droplet pattern, at block 330. During the first pass, the substrate 102 and the fluid dispenser 122 can move relative to each other in a translating direction along the stitch line. In a particular embodiment, the logic element can transmit information regarding the speed to the stage or a stage controller, to the fluid dispense head or a fluid dispense controller, or any combination thereof. FIG. 2A includes an illustration of an imprint field on the substrate after fluid droplets for the first pass have been dispensed. Fluid droplets are dispensed along a stitch line that extends from one corner to an opposite corner of the imprint field of the substrate 102. In a particular embodiment, the stitch line is a diagonal line that extends from one corner to an opposite corner of the imprint field of the substrate 102. In another embodiment, the logic element can transmit information to dispense, during a first pass, formable material along the stitch line by starting at an edge of the imprint field of the substrate and moving towards and ending at the stitch line.

In another embodiment, the method can further include offsetting the fluid dispenser 122 and substrate relative to each other before dispensing the formable material during the first pass. Offsetting will be in both the translating direction 208 and the other direction. The offset is to position the fluid dispenser 122 to allow the fluid droplets to be dispensed along the stitch line during a first pass. In one embodiment, the offset is performed to move the substrate 102 and the fluid dispenser 122 relative to each other in the translating direction (X-direction).

At block 340, the method can further include offsetting the fluid dispenser 122 and substrate relative to each other after dispensing the formable material during the first pass. Offsetting will be in both the translating direction 208 and the other direction. The offset is to position the fluid dispenser 122 to allow the fluid droplets to be dispensed along the stitch line during a second pass in the opposite direction. In one embodiment, the offset is performed to move the substrate 102 and the fluid dispenser 122 relative to each other in the translating direction (X-direction).

The method can include, during a second pass, dispensing the formable material to form a second part of the fluid droplet pattern, at block 350. During the second pass, the substrate 102 and the fluid dispenser 122 can move relative to each other in a translating direction along the stitch line. In particular, the logic element can transmit information regarding the preset speed to the stage or a stage controller, to the fluid dispense head or a fluid dispense controller, or any combination thereof. In another embodiment, the logic element can transmit information to dispense, during a second pass, formable material along the stitch line by starting at an edge of the imprint field of the substrate and moving towards and ending at the stitch line. FIG. 2B includes an illustration of an imprint field on the substrate with fluid droplets from the first and second passes. The fluid droplets dispensed during the second pass are along the stitch line with the trailing edge being adjacent the edge of the imprint field of the substrate 102.

At block 360, the method can include contacting the formable material with the template. In an embodiment, the template can have a patterned surface that has projections and recessions, and in another embodiment, the patterned surface can be a blank (a flat surface without any projections or recessions). The contact between the mold 112 of the template 108 and the formable material 124 causes recessions in the mold 112 to fill and fill in the gaps between fluid droplets. The proper dispensing of fluid droplets allows some of the formable material to flow toward the edge of the imprint field; however, the formable material 124 does not flow beyond the edges of the mold 112.

At block 370, the method includes curing the formable material to form a patterned layer corresponding to the pattern surface of the template 108. Curing can be performed by exposure to electromagnetic radiation. In an embodiment, the electromagnetic radiation can be ultraviolet radiation. In another embodiment, the formable material can be cured using heat. The patterned layer on the substrate 102 has a complementary pattern as compared to the patterned surface of the template 108. Projections along the patterned layer correspond to recessions in the patterned surface of the template, and recessions in the patterned layer correspond to projections along the patterned surface of the template. The recessions in the patterned layer are parts of the residual layer. A fluid dispense pattern can take many different shapes. An exemplary pattern includes a rectangular, grid pattern, a diamond pattern, another suitable pattern, or any combination thereof.

After reading this specification, skilled artisans will appreciate that many other fluid drop patterns can be formed using various stitch lines that allow fluid droplets to fill in a uniform RLT. The offset of substrate 102 and the fluid droplet dispenser 122 relative to each other can be performed without significantly affecting the ability to properly fill recessions in the template. Furthermore, more than two passes may be used to achieve fluid droplets along the stitch line.

Patterned layers formed in accordance with embodiments herein have fewer defects as compared to corresponding patterned layers where dispensing formable material occurs without using the offset. More particularly, it has been found that patterned layers formed in accordance with embodiments herein have fewer defects as compared to corresponding patterned layers having rows and columns of fluid droplets closest to the edges of the imprint field such centers of such fluid droplets do not lie at the proper locations with respect as DEE. Thus, the offset allows for good filling characteristics and reduce the likelihood of non-fill and extrusion defects.

Further, the apparatus described above can be included in method of manufacturing an article. The method of manufacturing an article can include a device. In one embodiment, the device can be a semiconductor integrated circuit device, a liquid crystal display device, an electric circuit element—such as a volatile or nonvolatile semiconductor memory, DRAM, SRAM, flash memory, MRAM, LSI, a CCD, an image sensor, or an FPGA—an optical element, a MEMS, a printing element, a sensor, a mold, or the like. The method of manufacturing an article can include forming a pattern on a substrate using the above-described imprint apparatus. In one embodiment, the substrate can be a wafer, a glass plate, or a film-like substrate. The method can further include a processing step of the substrate on which the pattern was formed. In one embodiment, the processing step can include etching. In one embodiment, the pattern can be formed by contacting formable material with a template having a surface, curing the formable material to form a layer corresponding to the surface of the template, and forming a pattern on the substrate by the cured material on the substrate. The method of manufacturing can further include processing the substrate on which the pattern was formed and manufacturing the article from the processed substrate to form the device as described above.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of generating a fluid droplet pattern on a substrate, the method comprising:

providing a fluid dispense system having fluid dispense ports;
determining a fluid droplet pattern of an imprint field for dispensing a formable material onto a substrate;
during a first pass, dispensing the formable material onto the substrate along a stitch line to form a first part of the fluid droplet pattern for an imprint field, wherein the substrate and the fluid dispense ports move relative to each other in a translating direction, wherein the stitch line is a diagonal line that runs from a first corner to a second corner of the imprint field, and wherein the first corner and the second corner are on opposite sides of a congruent side of the imprint field;
offsetting the substrate and the fluid dispense ports relative to each other in the translating direction and another direction, wherein offsetting the substrate and the fluid dispense ports relative to each other is performed after dispensing the formable material during the first pass; and
during a second pass, dispensing the formable material along the stitch line onto the substrate to form a second part of the fluid droplet pattern for the imprint field, wherein dispensing the formable material during the second pass is performed after offsetting the substrate and the fluid dispense ports relative to each other.

2. The method of claim 1, wherein the first corner and the second corner are on opposite sides of a diagonal of the imprint field.

3. The method of claim 1, wherein the stitch line comprises more than one segment.

4. The method of claim 3, wherein the stitch line comprises a horizontal segment.

5. The method of claim 3, wherein stitch line comprises a vertical segment.

6. The method of claim 1, wherein determining a substrate fluid drop pattern is for the imprint field.

7. The method of claim 1, wherein dispensing the formable material onto the substrate field along a stitch line to form the first part of the fluid droplet pattern for the imprint field comprises starting to dispense formable material at a first edge of the field and ending at the stitch line.

8. The method of claim 1, wherein dispensing the formable material onto the substrate along a stitch line to form the first part of the fluid droplet pattern for the imprint field comprises starting to dispense formable material at the stitch line and ending at a first edge of the imprint field.

9. The method of claim 8, wherein dispensing the formable material onto the substrate along a stitch line to form the second part of the fluid droplet pattern for the imprint field comprises starting to dispense formable material at the stitch line and ending at a second edge of the imprint field, wherein the first edge is opposite the second edge.

10. The method of claim 9, wherein dispensing the formable material onto the substrate along a stitch line to form the first part of the fluid droplet pattern for the imprint field comprises forming at least two rows of fluid droplets, wherein each row of fluid droplets has a different number of fluid droplets than the row either above or below it.

11. The method of claim 10, wherein after dispensing the formable material onto the substrate along a stitch line to form the second part of the fluid droplet pattern for the imprint field, each of the at least two rows has substantially the same number of fluid droplets.

12. A method of manufacturing an article, the method comprising:

providing a fluid dispense system having fluid dispense ports;

determining a fluid droplet pattern of the imprint field for dispensing a formable material onto a substrate;

during a first pass, dispensing the formable material onto the substrate along a stitch line to form a first part of the fluid droplet pattern for an imprint field, wherein the substrate and the fluid dispense ports move relative to each other in a translating direction, wherein the stitch line is a diagonal line that runs from a first corner to a second corner of the imprint field, and wherein the first corner and the second corner are on opposite sides of a congruent side of the imprint field;

offsetting the substrate and the fluid dispense ports relative to each other in the translating direction and another direction, wherein offsetting the substrate and the fluid dispense ports relative to each other is performed after dispensing the formable material during the first pass;

during a second pass, dispensing the formable material along the stitch line onto the substrate to form a second part of the fluid droplet pattern for the imprint field, wherein dispensing the formable material during the second pass is performed after offsetting the substrate and the fluid dispense ports relative to each other;

contacting the formable material with a template having a surface;

curing the formable material to form a layer corresponding to the surface of the template;

forming a pattern on the substrate by the cured material on the substrate;

processing the substrate on which the pattern has been formed; and manufacturing the article from the processed substrate.

* * * * *